US008434036B2

(12) United States Patent
Hasegawa

(10) Patent No.: US 8,434,036 B2
(45) Date of Patent: Apr. 30, 2013

(54) ARITHMETIC PROGRAM CONVERSION APPARATUS, ARITHMETIC PROGRAM CONVERSION METHOD, AND PROGRAM

(75) Inventor: Shota Hasegawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 657 days.

(21) Appl. No.: 12/689,579

(22) Filed: Jan. 19, 2010

(65) Prior Publication Data

US 2010/0185836 A1    Jul. 22, 2010

(30) Foreign Application Priority Data

Jan. 20, 2009 (JP) ................. 2009-010015

(51) Int. Cl.
*G06F 9/44* (2006.01)
*G06F 9/302* (2006.01)
*G06F 7/38* (2006.01)
*G06F 9/45* (2006.01)
*G06F 17/50* (2006.01)

(52) U.S. Cl.
USPC ............ 716/103; 716/100; 716/101; 716/104

(58) Field of Classification Search ................... 716/100, 716/101, 103, 104; 712/221
See application file for complete search history.

(56) References Cited

U.S. PATENT DOCUMENTS

| 4,215,406 | A | * | 7/1980 | Gomola et al. | ................. | 700/95 |
| 4,227,245 | A | * | 10/1980 | Edblad et al. | .................... | 700/95 |
| 4,389,706 | A | * | 6/1983 | Gomola et al. | .................... | 700/1 |
| 6,745,160 | B1 | * | 6/2004 | Ashar et al. | ..................... | 703/14 |
| 7,383,166 | B2 | * | 6/2008 | Ashar et al. | ..................... | 703/14 |

FOREIGN PATENT DOCUMENTS

| JP | 01-207823 | 8/1989 |
| JP | 2001-043067 | 2/2001 |
| JP | 2002-149397 | 5/2002 |
| JP | 2008-033729 | 2/2008 |

OTHER PUBLICATIONS

M. Willems et al., "System Level Fixed-Point Design Based on an Interpolative Approach", Institute for Integrated Systems in Signal Processing , Aachen University of Technology, {willems,buersgen,keding,groetker,meyr}@ert.rwth-aachen.de, 1997.
C. Shi et al., "Automated Fixed-point Data-type Optimization Tool for Signal Processing and Communication Systems", DAC '04, Jun. 7-11, 2004, San Diego, CA , pp. 478-483.

(Continued)

*Primary Examiner* — Sun Lin
(74) *Attorney, Agent, or Firm* — Wolf, Greenfield & Sacks, P.C.

(57) ABSTRACT

An arithmetic-program conversion apparatus includes: a program storage section storing an arithmetic program describing a circuit by a logical expression including a plurality of input and output variables, and operators; if the expression has three input variables or more, an intermediate-variable generation section generating an intermediate variable for converting the expression into a plurality of binomials including input and output variables; if the intermediate variable is generated, an expression conversion section converting the logical expression into a plurality of binomials including a binomial for obtaining the intermediate variable and a binomial obtaining the output variable from the intermediate variable; if a plurality of binomials are generated, an expression update section updating the stored original expression; a bit-width determination section determining bit widths of the output, input, and intermediate variables of the expression; and a bit-width storage section storing the bit widths of the output, input, and intermediate variables.

12 Claims, 8 Drawing Sheets

OTHER PUBLICATIONS

S. Roy et al. "An Algorithm for Converting Floating-Point Computations to Fixed-Point in MATLAB based FPGA design", DAC '04, Jun. 7-11, 2004, San Diego, CA, pp. 484-487.

D. Lee et al., "MiniBit: Bit-Width Optimization via Affine Arithmetic", DAC 2005, Jun. 13-17, 2005, Anaheim, CA, pp. 837-840.

* cited by examiner

```
tmpx1 = A * C;
X = tmpx1 * B;
y = d + e + f;
tmpz1 = G * H;
tmpz2 = I * J;
Z = tmpz1 + tmpz2 +
    k + l;
```

FIG. 10

```
TMPX1 = A * C;
X = TMPX1 * B;
y = d + e + f;
TMPZ1 = G * H;
TMPZ2 = I * J;
Z = TMPZ1 + TMPZ2 +
    k + l;
```

FIG. 11

```
TMPX1 = A * C;
X = TMPX1 * B;
tmpy1 = d + e;
y = tmpy1 + f;
TMPZ1 = G * H;
TMPZ2 = I * J;
tmpz3 = k + l;
tmpz4 = TMPZ1 + tmpz3;
Z = TMPZ2 + tmpz4;
```

FIG. 12

```
TMPX1 = A * C;
X = TMPX1 * B;
TMPY1 = D + E;
Y = TMPY1 + F;
TMPZ1 = G * H;
TMPZ2 = I * J;
TMPZ3 = K + L;
TMPZ4 = TMPZ1 + TMPZ3;
Z = TMPZ2 + TMPZ4;
```

ARITHMETIC PROGRAM CONVERSION APPARATUS, ARITHMETIC PROGRAM CONVERSION METHOD, AND PROGRAM

BACKGROUND OF THE INVENTION

1. Field of the Invention

The present invention relates to an arithmetic-program conversion apparatus, an arithmetic-program conversion method, and a program capable of obtaining a hardware model program by converting an arithmetic program, such as an algorithm model program, etc.

2. Description of the Related Art

Japanese Unexamined Patent Application Publication No. 2001-43067 has disclosed an arithmetic apparatus capable of converting a numeric value from a floating-point notation to a fixed-point notation while keeping a loss of the number of significant digits to a minimum.

This arithmetic apparatus includes a maximum-exponent-part-value detection section, which interprets k-bit data stored in a storage section as floating-point data having an m-bit mantissa part and an n-bit exponent part, and detects a maximum value r of the exponent part of the data in a block.

And the arithmetic apparatus converts each data in the block into floating-point data, which is represented by a pair of a maximum value r of an exponent part and a mantissa part, and performs arithmetic processing on the mantissa part of the converted data by an arithmetic processing section.

Also, the arithmetic apparatus completes predetermined arithmetic processing on the data in the block, and converts each data into fixed-point data on the basis of the maximum value r before outputting the data to the outside.

Japanese Unexamined Patent Application Publication No. 2002-149397 has disclosed a method of generating fixed-point data, which allows improving a bit decoding rate while reducing the size of a circuit.

In this method, maximum floating-point data is detected among floating-point data, and the difference between an exponent-part value of floating-point data and that of the maximum floating-point data is obtained.

Next, in this method, a mantissa part of the floating-point data is shifted by the difference, and a predetermined number of bits of the shifted mantissa part are extracted as fixed-point data.

In this manner, in a hardware circuit system, various kinds of variables to be arithmetically processed are subjected to arithmetic processing as fixed-point variables (variables having fixed bit widths) even if the variables are in a floating-point notation.

SUMMARY OF THE INVENTION

Incidentally, various EDA (Electronic Design Automation) tools are used in designing a hardware circuit.

In a circuit design using an EDA tool, a circuit designer inputs a hardware model of a circuit to be designed into the EDA tool. Such hardware models include an RTL (Register Transfer Language) model, for example.

When a hardware model is input, the EDA tool generates a net-list date, etc., from the hardware model.

Also, it is possible to automatically generate, for example, wiring pattern data in an integrated circuit from net-list data. Moreover, it is possible to form an exposure mask for forming the wiring pattern data. A circuit system that the circuit designer has designed can be obtained by manufacturing a circuit using the exposure mask.

However, in a hardware model, such as an RTL model, it is necessary for a designer to describe a circuit to be designed using registers and transistors. Alternatively, it is necessary to for a designer to describe a circuit using binomial expressions having two inputs and one output, which are easily converted to transistors.

In this regard, a binomial expression can be described using a circuit element module having two inputs and one output for GUI (Graphical User Interface), for example.

Accordingly, when inputting a hardware model into an EDA tool, it is necessary for a circuit designer to specifically describe the number of bits of a register, etc.

As a result, before inputting a hardware model into an EDA tool, it is necessary for a circuit designer to determine the number of bits (bit width) of each variable stored in a register.

And the determination of the bit width of a variable means fixing a bit precision of a variable, and determining the variable to be in a fixed-point notation.

Also, a bit precision of a variable is manually determined by a circuit designer on the basis of past experiences, etc., at a real manufacturing site.

Accordingly, a bit precision of a variable is not necessarily optimized for each circuit to be designed. It is thought that an experienced circuit designer can optimize a bit precision of a variable. However, for example, it is difficult for an inexperienced circuit designer to optimize a bit precision of a circuit.

As a result, if a bit precision of a variable is higher than a necessary precision, the size of a circuit achieving a binomial expression handing a variable having the excess bit precision becomes large.

Also, a circuit achieving a binomial expression in the subsequent stage of that binomial expression receives an input variable having the excess bit precision, and thus the size of the circuit to be designed becomes significantly large compared with the case of a circuit optimized to a necessary precision.

Also, if a bit precision of a variable is lower than a necessary precision, a rounding error occurs in a binomial expression handing a variable having an insufficient bit precision.

Also, a circuit achieving a binomial expression in the subsequent stage of that binomial expression receives an input variable with a rounding error, and thus even if a circuit itself in the subsequent stage is optimized, the error becomes large. As a result, an error greater than a permissible error occurs in the output variable.

In this manner, if the bit precision of variables is not optimized in each binomial expression, various problems occur.

In addition, in a hardware model having been input in an EDA tool, a plurality of binomial expressions are arranged in the order determined and input by a circuit designer.

And if the circuit designer has not fully studied the order of operations of a binomial expression, even if a bit precision of a variable in each binomial expression is optimized, a part of the binomial expressions are sometimes operated with an excessive bit precision.

In this manner, even in the case where there is no impact on the permissible error of an output variable, there is a binomial expression operated with an excessive bit precision in part. Thereby, the size of a circuit to be designed becomes larger than a circuit size of the case in which the order of operations is optimized.

In view of these circumstances, the present inventor has earnestly carried on research independently.

As a result, the present inventor has figured out that circuit designers perform logic verification of a circuit using an upper arithmetic program produced by abstracting a hardware model program furthermore.

In this manner, as an upper arithmetic program created before designing a hardware model program, for example, there is an algorithm model program including a description of input and output relationships of a circuit to be designed.

Also, the present inventor has found out that it is possible to obtain an arithmetic program including a binomial expression having two inputs and one output and capable of being used as a hardware model by converting an arithmetic program, such as an algorithm model program.

Also, the present inventor has found out that it is possible to obtain a bit precision suitable for a circuit to be designed as a bit precision of variables (input variables and output variable) included in an arithmetic program including the binomial expression by arithmetic processing.

It is desirable to provide an arithmetic program conversion apparatus, an arithmetic-program conversion method, and a program, which are capable of obtaining a hardware model program from an arithmetic program, such as an algorithm model program, etc.

According to an embodiment of the present invention, there is provided an arithmetic-program conversion apparatus including: a program storage section storing an arithmetic program describing a circuit to be designed by a logical expression including a plurality of input variables, operators, and output variables; if the logical expression having three input variables or more is stored in the program storage section, an intermediate-variable generation section generating an intermediate variable to be used for converting the logical expression into a plurality of binomial expressions including two input variables and one output variable; if the intermediate variable is generated by the intermediate-variable generation section, an expression conversion section converting the logical expression into a plurality of binomial expressions including a binomial expression for obtaining the intermediate variable and a binomial expression obtaining the output variable from the intermediate variable; if a plurality of binomial expressions are generated by the conversion processing of the expression conversion section, an expression update section updating the original logical expression stored in the program storage section by the plurality of binomial expressions; a bit-width determination section determining bit widths of the output variable, the input variables, and the intermediate variable of the logical expression stored in the program storage section; and a bit-width storage section storing the bit width of the output variable, the bit width of the input variables, and the bit width of the intermediate variable.

According to another embodiment of the present invention, there is provided a method of converting an arithmetic program, the method including the steps of: generating intermediate variables to be used for converting a logical expression constituting an arithmetic program stored in a program storage section and including three input variables or more, an operator, and an output variable into a plurality of binomial expressions including two input variables and one output variable; converting the logical expression into a plurality of binomial expressions including a binomial expression for obtaining the intermediate variable and a binomial expression obtaining the output variable from the intermediate variable; updating the original logical expression stored in the program storage section by the plurality of the converted binomial expressions; determining bit widths of the output variable, the input variables, and the intermediate variable included in the logical expression stored in the program storage section; and storing the bit width of the output variable, the bit width of the input variable, and the bit width of the intermediate variable in a bit-width storage section.

According to another embodiment of the present invention, there is provided A program for causing a computer to achieve processing including: a program storage section storing an arithmetic program describing a circuit to be designed by a logical expression including a plurality of input variables, operators, and output variables; if the logical expression having three input variables or more is stored in the program storage section, an intermediate-variable generation section generating an intermediate variable to be used for converting the logical expression into a plurality of binomial expressions including two input variables and one output variable; if the intermediate variable is generated by the intermediate-variable generation section, an expression conversion section converting the logical expression into a plurality of binomial expressions including a binomial expression for obtaining the intermediate variable and a binomial expression obtaining the output variable from the intermediate variable; if a plurality of binomial expressions are generated by the conversion processing of the expression conversion section, an expression update section updating the original logical expression stored in the program storage section by the plurality of binomial expressions; a bit-width determination section determining bit widths of the output variable, the input variables, and the intermediate variable of the logical expression stored in the program storage section; and a bit-width storage section storing the bit width of the output variable, the bit width of the input variables, and the bit width of the intermediate variable.

By the above-described embodiments, a plurality of logical expressions of an arithmetic program, such as an algorithm model program, are converted into binomial expressions, and stored in the program storage section as a binomial arithmetic program.

Also, the bit width of output variables, the bit width of input variables, and the bit width of intermediate variables of a binomial arithmetic program are determined by the bit-width determination section, and are stored in the bit-width storage section.

Accordingly, a binomial arithmetic program stored in the program storage section includes variables, all the bit widths of which have been fixed, and thus can be used as a hardware model program.

By the present invention, it is possible to obtain a binomial arithmetic program that can be used as a hardware model program from an arithmetic program, such as an algorithm model program, etc.

BRIEF DESCRIPTION OF THE DRAWINGS

FIG. 6 is an example of an algorithm model program to be stored in the program storage section in FIG. 1;

FIG. 7 is an example of an intermediate model program, in the process of conversion, to be stored in the program storage section in FIG. 1 (in a state of multiplication-and-division output variables being fixed);

FIG. 8 is an example of an intermediate model program, in the process of conversion, to be stored in the program storage section in FIG. 1 (in a state of multiplication-and-division input variables being fixed);

FIG. 9 is an example of an intermediate model program, in the process of conversion, to be stored in the program storage section in FIG. 1 (in a state of multiplication-and-division operations being binomialized);

FIG. 10 is an example of an intermediate model program, in the process of conversion, to be stored in the program storage section in FIG. 1 (in a state of fixed intermediate variables for multiplication and division);

FIG. 11 is an example of an intermediate model program, in the process of conversion, to be stored in the program storage section in FIG. 1 (in a state of addition-and-subtraction operations being binomialized); and FIG. 12 is an example of a binomial model program (hardware model program) to be stored in the program storage section in FIG. 1.

DESCRIPTION OF THE PREFERRED EMBODIMENTS

In the following, a description will be given of an embodiment of the present invention with reference to the drawings. In this regard, the description will be given in the following order.

Figure 1:
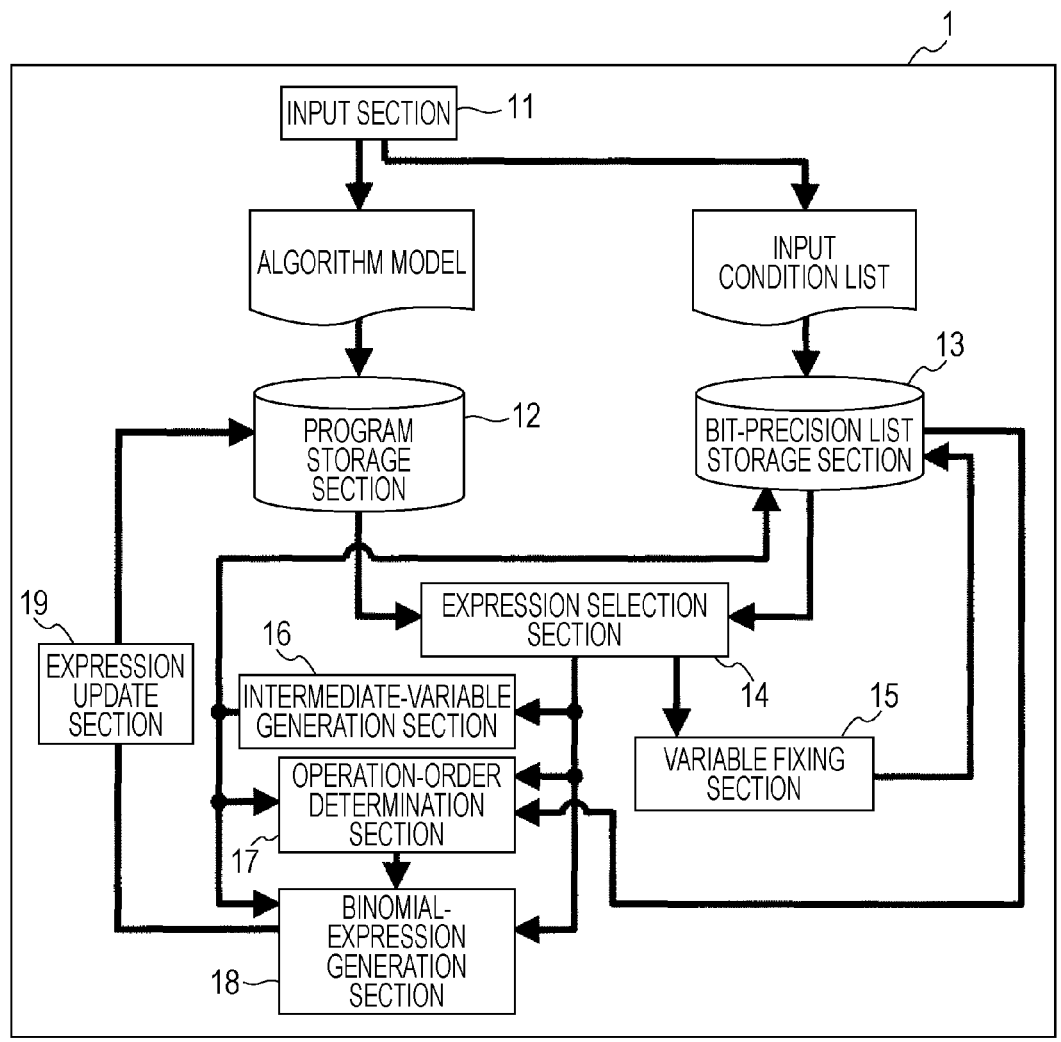
FIG. 1 is a configuration diagram of a hardware-model generation apparatus to which an arithmetic-program conversion apparatus according to an embodiment of the present invention is applied.

1. Configuration of hardware-model generation apparatus to which an arithmetic-program conversion apparatus is applied 2. Generation operation of hardware-model program described by binomial expressions from an algorithm model program 1. Configuration of Hardware-Model Generation Apparatus FIG. 1 is a configuration diagram illustrating a hardware-model generation apparatus to which an arithmetic-program conversion apparatus according to an embodiment of the present invention is applied.

A hardware-model generation apparatus 1 generates a binomial model program which is described by a plurality of binomial expressions and can be used as a hardware-model program from an algorithm model program in which an input-and-output relationship of a circuit to be designed is described by input-and-output description expressions.

Also, the hardware-model generation apparatus 1 generates information of bit precision of a plurality of variables included in binomial expressions of the binomial model program.

In this manner, the hardware-model generation apparatus 1 binomializes the logical expressions in a circuit model program, and fixes the variables of the binomial expressions.

And it becomes possible to use the binomial model program as a hardware model for generating a net list, etc., in the same manner as an RTL model program.

In the following, an algorithm model program is simply called an algorithm model, a binomial-expression model program is simply called a binomial expression model, and a circuit model program is called a circuit model.

In FIG. 6, described later, illustrates an example of an algorithm model.

The algorithm model in FIG. 6 has three input-and-output description expressions.

The input-and-output description expressions are logical expressions of a circuit to be designed, which are independent for each output data or output signal.

Also, in the input-and-output description expression, input data or an input signal to be used for obtaining output data or an output signal is described as a variable.

The input-and-output description expression includes one output variable, a plurality of input variables and a plurality of operators.

The output variable corresponds to output data or an output signal.

The input variable corresponds to input data or an input signal for obtaining output data or an output signal.

The operator is a symbol of operation, such as addition, subtraction, multiplication, and division, etc., and represents arithmetic processing of a plurality of input data or a plurality of input signals.

And the output variable is described on the left side of an input-and-output description expression. Input variables and operators are described on the right side of an input-and-output description expression. In one input-and-output description expression, three input variables or more may be described.

In this regard, in the hardware-model generation apparatus 1, a variable of an input-and-output description expression is handled as a floating-point variable.

FIG. 12, described later, illustrates an example of a binomial expression model.

The binomial expression model in FIG. 12 has 9 binomial expressions.

The binomial expression includes input variables, an operator and an output variable.

When a binomial expression is regarded as a function module having two inputs and one output, an input variable corresponds to input data or an input signal of the function module, and an output variable corresponds to output data or an output signal of the function module, and an operator represents arithmetic processing on two input variables with each other in the function module.

And the output variable is described on the left side of the binomial expression. The input variables and the operator are described on the right side of the binomial expression. One binomial expression can include the description of two input variables.

In this regard, in the hardware-model generation apparatus 1, the variables of a binomial expression model finally become fixed-point variables.

In this regard, a binomial expression model ought to be a model having the same description level as an RTL model, for example. That is to say, a binomial expression model ought to be a model described by a plurality of binomial expressions, and having fixed bit widths of binomial input variables, an operator, and an output variable.

Also, an algorithm model to be used for obtaining a binomial expression model may be a model other than the above-described input-and-output model in which the input and output of a circuit is described by a logical expression for each output.

For example, if an algorithm model has obtained a permissible error of the output variable of each logical expression and a maximum input value and a minimum input value of an input variable, the model can be used as an algorithm model.

The hardware-model generation apparatus 1 in FIG. 1 has an input section 11, a program storage section 12, a bit-precision list storage section 13, an expression selection section 14, a variable fixing section 15, an intermediate-variable generation section 16, an operation-order determination section 17, a binomial-expression generation section 18, and an expression update section 19.

The input section 11 has, for example, a keyboard or a pointing device. The input section 11 generates input data corresponding to an operation of the keyboard or the pointing device. A user inputs an algorithm model, etc., into the hardware-model generation apparatus 1 using the input section 11.

In this regard, the input section 11 may have a device for reading a removable recording medium, such as a CD-ROM (Compact Disc Read Only Memory), etc., and may read an algorithm model, etc., recorded on a recording medium in advance.

The program storage section 12 stores a circuit model described by a model description expression.

The program storage section 12 first stores an algorithm model as exemplified in FIG. 6.

And, by the binomial-expression model generation processing, the program storage section 12 finally stores a binomial expression model exemplified in FIG. 12.

Also, the program storage section 12 stores an intermediate model in process of conversion from an algorithm model to a binomial expression model. The intermediate models are exemplified in FIGS. 7 to 11.

And, if an algorithm model is stored, the program storage section 12 stores a plurality of input-and-output description expressions (logical expressions) of the algorithm model as model description expressions.

If a binomial expression model is stored, the program storage section 12 stores a plurality of binomial expressions of the binomial expression model as model description expressions.

The bit-precision list storage section 13 stores a bit-precision list 21.

Figure 2:
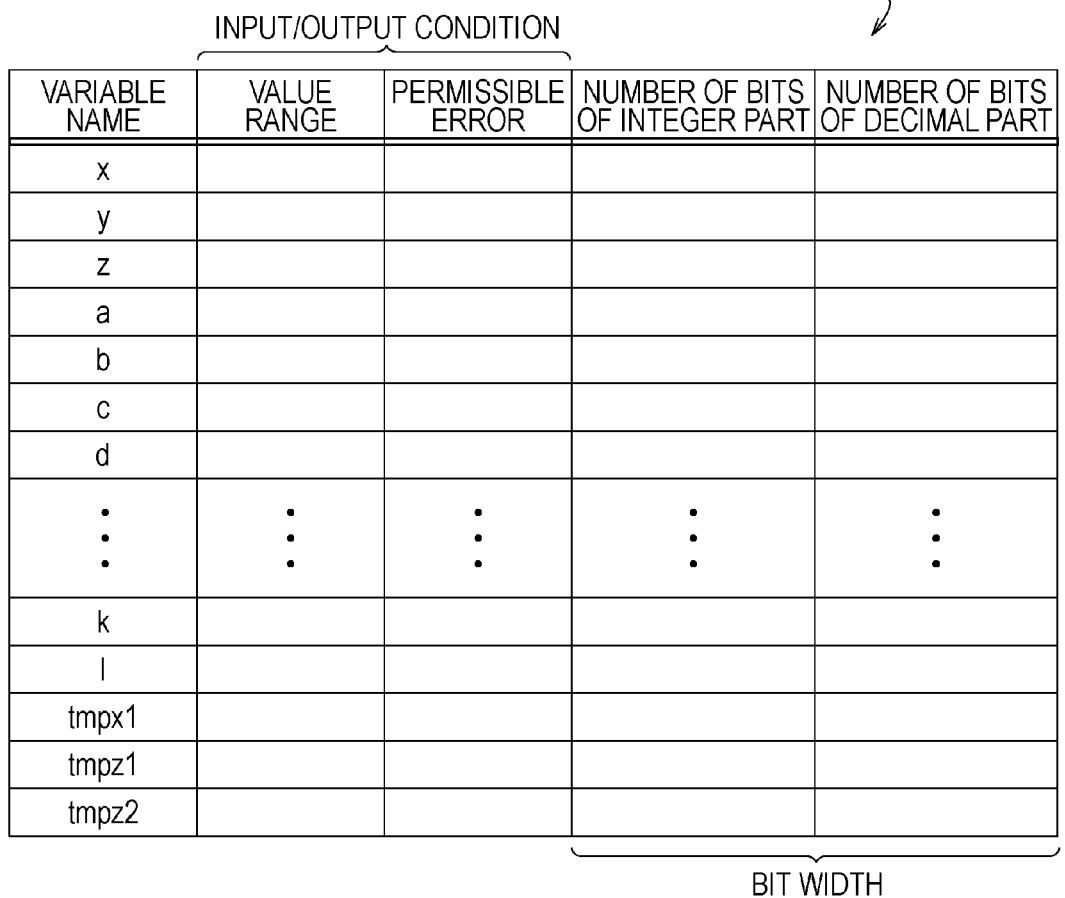
FIG. 2 is an example of a bit precision list stored in the bit-precision list storage section in FIG. 1.

FIG. 2 illustrates an example of a list structure of the bit precision list 21 stored in the bit-precision list storage section.

The bit-precision list 21 in FIG. 2 includes a plurality of records for each variable (input variables, an output variable, and an intermediate variable described later of a model description expression) stored in the program storage section 12.

And, the bit-precision list storage section 13, for example, first stores all the variables included in FIG. 6, and finally stores all the variables included in FIG. 12.

Each record (each row in FIG. 2) of the bit-precision list 21 stores a variable name, a range of a variable value, a permissible error of a variable, a number of bits of an integer part of a variable, and a number of bits of decimal part of a variable.

In this regard, a range of a variable value and a permissible error of a variable may be input from, for example, the input section 11.

Also, the sum of the number of bits of an integer part and the number of bits of a decimal part becomes a variable bit width (bit precision).

In this regard, if the bit-precision list 21 stores the number of bits of an integer part and the number of bits of a decimal part, the variable is a fixed-point variable.

On the contrary, if the bit-precision list 21 does not store at least one of the number of bits of an integer part and the number of bits of a decimal part, the variable is a floating-point variable.

Also, before the binomial-expression model generation processing is performed, the bit-precision list 21 stores all the variables in FIG. 6. After the binomial-expression model generation processing is performed, the bit-precision list 21 stores all the variables in FIG. 12.

The expression selection section 14 determines the order of binomializing model description expressions, and the order of changing variables into a fixed-point notation. The expression selection section 14 finally makes a determination such that an impact of a rounding error becomes small on the basis of the types of the four basic arithmetic operations and the bit precision (bit width) of each variable.

In this regard, the rounding error is liable to occur, for example, when an operation of multiplication or division is performed, or when an operation is performed with a reduced number of bits of the input variables.

This is because a package area of a circuit is limited in achieving as hardware, and thus a tradeoff invariably occurs between a signal quality, such as an image quality, etc., and a package area.

Also, this is because significant bit reduction is performed on the arithmetic processing, by which the bit width becomes large after the operation so that a package area necessary for the arithmetic processing and the subsequent arithmetic processing can be restrained effectively.

And, a rounding error occur by such bit-width reduction processing.

The expression selection section 14 focuses attention on the variables related to multiplication and division or a variable having a large bit width using this characteristic, and determines the binomialization and the changing to a fixed point notation from the variables. The expression selection section 14 specifically performs processing of a flowchart in FIG. 4 described later.

In the following, model description expressions obtained by the expression selection section 14 are called obtained model description expressions (obtained logical expressions).

Figure 4:
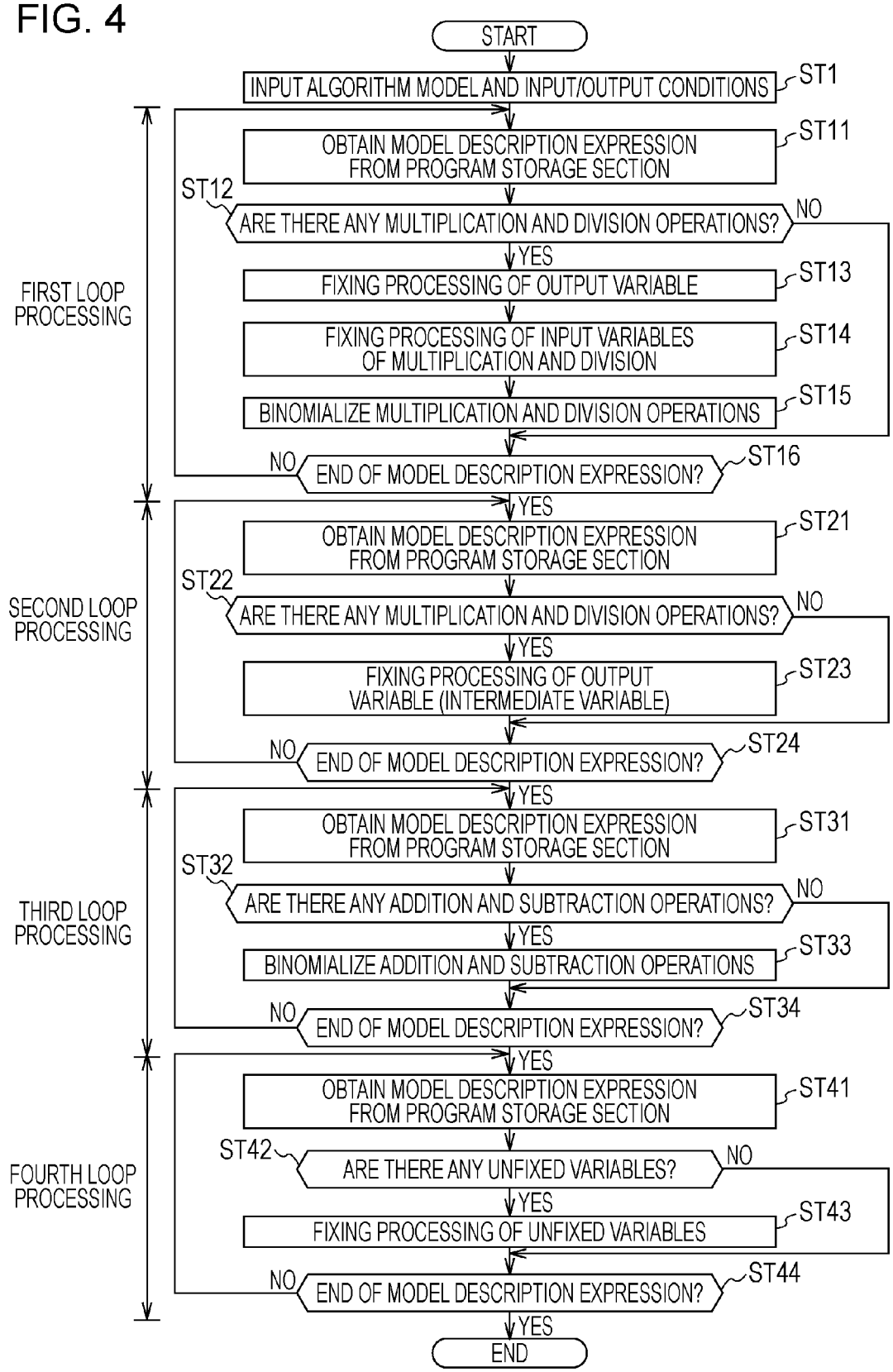
FIG. 4 is a flowchart illustrating a flow of hardware-model binomial model generation processing in the hardware-model generation apparatus in FIG. 1.

In the flowchart in FIG. 4, the expression selection section 14 obtains the obtained model description expression for each one row from the beginning of the circuit model stored in the program storage section 12 in sequence.

Next, the expression selection section 14 determines a binomial operation (binomial operator) of interest and a variable of interest each time the expression selection section 14 obtains a model description expression on the basis of the circuit model stored in the program storage section 12 and the information of the bit precision stored in the bit-precision list storage section 13.

Next, the expression selection section 14 performs binomializing of a binomial operation of interest and changing to a fixed point (determining bit widths) of a variable of interest, and stores the result into the program storage section 12 and the bit-precision list storage section 13.

And the expression selection section 14 repeats this processing until all the model description expressions of the circuit model stored in the program storage section 12 are binomialized, and all the variables are changed to a fixed point notation.

Thereby, the expression selection section 14 roughly performs the following processing in sequence.

1. Focus attention on an output variable group of logical expressions carrying out multiplication and division, and fixing these.

2. Focus attention on an input variable group to be subjected to multiplication and division, and fix these.

3. Focus attention on an input variable group of logical expressions carrying out multiplication and division, and determine the order of operations.

4. Focus attention on an intermediate variable group generated for storing values produced by multiplication and division, and fix these.

5. Focus attention on an input variable group of logical expressions carrying out addition and subtraction, and determine the order of operations.

6. Focus attention on an intermediate variable group generated for storing values produced by addition and subtraction, and fix these.

The variable fixing section 15 determines the bit width of a variable of interest of the obtained model description expression. Specifically, the variable fixing section 15 repeatedly performs processing in FIG. 5.

Figure 5:
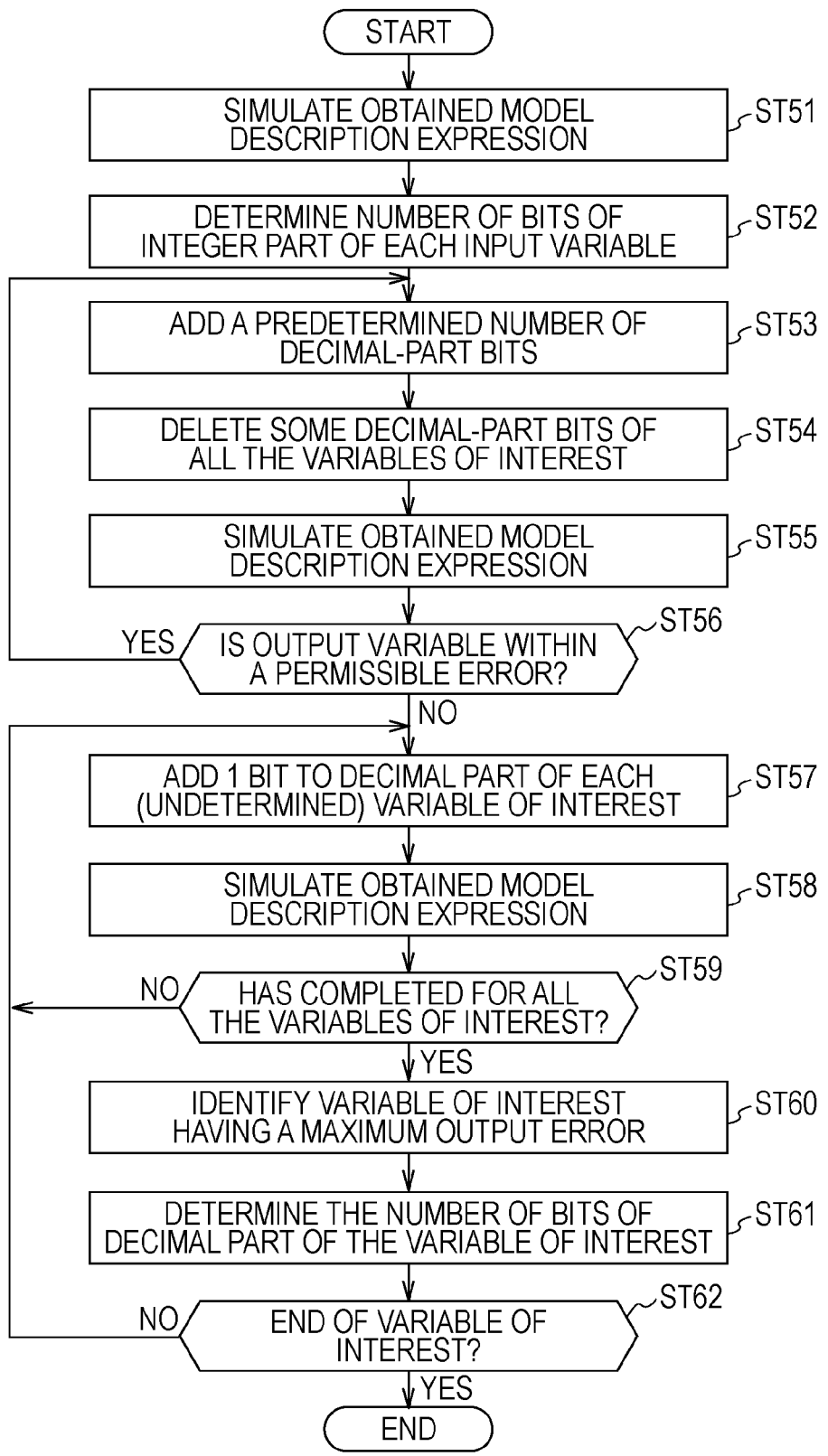
FIG. 5 is a flowchart illustrating fixing processing of variables in the hardware-model generation apparatus in FIG. 1.

In the processing in FIG. 5, the variable fixing section 15 reduces the bit width of a variable group in a range of a permissible error first. If the permissible error is exceeded, a variable producing a largest output error at the final stage is identified, and the bit width is fixed from this variable. All of these except for the specification of a permissible error is processed automatically.

In this manner, the bit width is determined by the variable which produces a largest output error so that the variable fixing section 15 can fix the variables to a minimum necessary bit width while keeping the impact of the rounding error at a minimum.

Also, a variable of interest at a preceding stage is identified, and only the variable is converted into a fixed point variable so that the variable fixing section 15 can determine a linear amount of processing without being influenced by the other operations.

And by repeated processing the processing in FIG. 5, the variable fixing section 15 finally determines the bit width of the output variable of the obtained model description expression, the bit width of the input variables, and further determines the bit width of the intermediate variable.

In the following, a variable processed by the variable fixing section 15 is called a fixed variable.

The intermediate-variable generation section 16 generates intermediate variables to be used for converting binomial operations of interest into binomial expressions out of the operations included in the obtained model description expression.

For example, if the obtained model description expression includes only binomial operations (binomial operators) of interest, the number of intermediate variables to be generated ought to be 1 subtracted from the number of binomial operators of interest.

Also, if the obtained model description expression includes an operator other than binomial operations (binomial operators) of interest, for example, the number of intermediate variables to be generated ought to be the same number as that of the binomial operators of interest.

In this regard, the intermediate variables generated by the intermediate-variable generation section 16 have unfixed bit widths, and thus are floating-point variables.

The operation-order determination section 17 determines the order of operations in the case of converting the obtained model description expression into a plurality of logical expressions, such as binomial expressions, etc. The operation-order determination section 17 determines the order of operations so that the rounding error becomes small on the basis of the bit width of the fixed variables (variable group) and the obtained model description expression.

In this regard, rounding errors include a rounding error which occurs when the number of significant digits is removed in multiplication and division, and a rounding error which occurs when bits to be operated are removed in addition and subtraction, etc.

For example, if the obtained model description expression includes a plurality of fixed variables, the operation-order determination section 17 determines the order of operations such that a variable with fewer number of bit width is operated first, and then a variable with a larger number of bit width is operated.

In addition, for example, if the obtained model description expression includes already-fixed fixed-point variables, the operation-order determination section 17 determines the order of operations so as to operate unfixed floating-point variables first, and then operate the fixed variables.

This is because, in the processing described later in this embodiment, one obtained model description expression may mixedly include fixed-point variables and floating-point variables. In this case, the floating-point variables are variables which are not subjected to multiplication and division, and thus are only slightly influenced by rounding errors.

Also, this is because the operations with little influence by rounding errors are performed in advance so that the number of operations with rounding errors is reduced, and thus an increase in rounding errors is restrained.

Also, the operation-order determination section 17 determines the assignment of a plurality of the input variables included in the obtained model description expression to a plurality of binomial expressions (the expressions operating on the output variable of the obtained model description expression and the binomial expression operating on intermediate variables) on the basis of these determination results.

For example, if the obtained model description expression includes three input variables, the operation-order determination section 17 assigns the two input variables determined to be input variables operated in advance in the order of operations to the operation of intermediate variables, and assigns the remaining variables determined to be input variables operated later and the intermediate variables to the operation of the output variable.

The binomial-expression generation section 18 generates a plurality of logical expressions including at least one binomial expression from the obtained model description expression on the basis of the assignment of the plurality of the variables by the operation-order determination section 17.

Specifically, the binomial-expression generation section 18 binomializes a binomial operation of interest, and obtains logical expressions from which the output variable of the obtained model description expression is obtained from the other operations.

In this regard, the logical expression from which the output variables are obtained sometimes becomes a binomial expression.

For example, in the case of an obtained model description expression having three input variables, a first binomial expression by which intermediate variables are obtained from the two input variables of the obtained model description expression, and a second binomial expression by which the output variable is obtained from the remaining input variables of the obtained model description expression and intermediate variables are generated.

And, the intermediate variable becomes output variables in the first binomial expression, and becomes the input variables in the second binomial expression.

The expression update section 19 updates the obtained model description expression stored in the program storage section 12 by the plurality of the binomial expressions generated by the binomial-expression generation section 18.

And, the obtained model description expressions stored in the program storage section 12 are updated by a plurality of binomial expressions in sequence, so that the algorithm model stored in the program storage section 12 is converted into a binomial expression model described by a plurality of binomial expressions.

Figure 3:
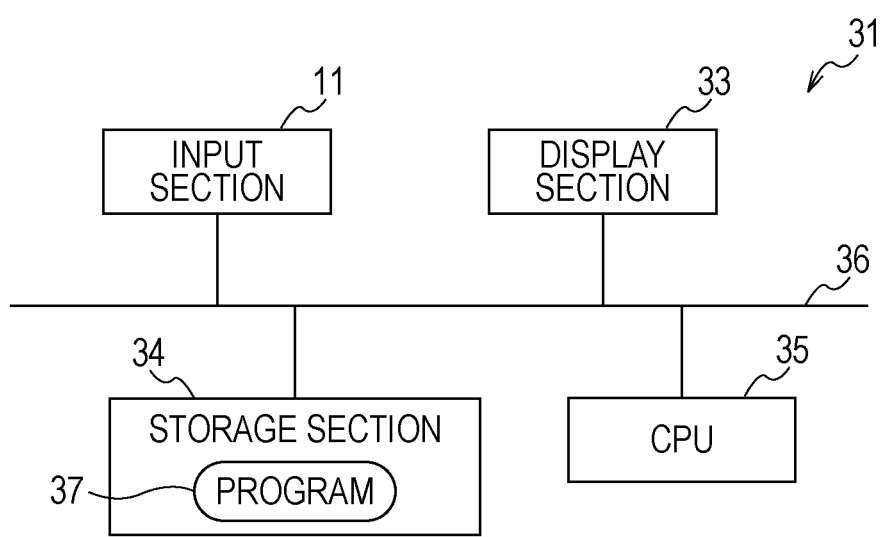
FIG. 3 is an example of a configuration of a computer apparatus to be used for achieving the hardware-model generation apparatus in FIG. 1.

In this regard, the hardware-model generation apparatus 1 in FIG. 1 can be achieved using, for example, a computer apparatus 31 in FIG. 3. The computer apparatus 31 has an input section 11, a display section 33, a storage section 34, a CPU (Central Processing Unit) 35 and a system bus 36 connecting these.

The storage section 34 stores a program for achieving the hardware-model generation apparatus 1 in the computer apparatus 31.

And, the CPU 35 executes a program 37 so that the hardware-model generation apparatus 1 is achieved in the computer apparatus 31. Also, the storage section 34 functions as the program storage section 12 and the bit-precision list storage section 13.

Also, the program 37 in FIG. 3 may be a computer-readable program. For example, the program 37 may be a program recorded in a recording medium, such as a CD-ROM, etc., for example, and may be a program downloaded from a server through a transmission medium, such as the Internet, etc.

2. Operation of Hardware-Model Generation Apparatus

Next, a description will be given of an operation of the hardware-model generation apparatus 1 in FIG. 1.

FIG. 4 illustrates a general processing flow for obtaining a binomial expression model from an algorithm model which can be used as a hardware model. The flowchart in FIG. 4 is executed mainly by the expression selection section 14.

Also, FIG. 5 illustrates a flow of fixing processing of input variables. The flowchart in FIG. 5 is executed by the variable fixing section 15.

Also, FIGS. 6 to 12 illustrate an example of a circuit model converted by the hardware-model generation apparatus 1 in FIG. 1.

FIG. 6 is an algorithm model, FIG. 12 is a binomial expression model that can be used as a hardware model. Also, FIGS. 7 to 11 are intermediate models.

In the following description, a description will be given of processing in FIGS. 4 and 5 with reference to the example in FIGS. 6 to 12.

In this regard, in FIGS. 6 to 12, fixed fixed-point variables are described in capital letters, and unfixed floating-point variables are described in small letters.

As shown in FIG. 4, the user operates the input section 11 of the hardware-model generation apparatus 1 to input a plurality of input-and-output description expressions of an algorithm model, and input/output conditions of input variables and an output variable included in the input-and-output description expressions (step ST1). Thereby, the input section 11 generates input data.

And, the program storage section 12 stores, for example, the algorithm model in FIG. 6. Three input-and-output description expressions (model description expressions) are stored in the algorithm model in FIG. 6.

Also, the bit-precision list 21 in FIG. 2 is stored in the bit-precision list storage section 13.

The bit-precision list 21 stores the input/output conditions of the 15 variables in FIG. 6.

Also, the bit-precision list storage section 13 stores, as input/output conditions, for example, a range of input value of the input variable, and a permissible error of the output variable.

When the program storage section 12 stores an algorithm model, and the bit-precision list storage section 13 stores a bit-precision list 21, the hardware-model generation apparatus 1 starts generation processing of a binomial expression model having the bit precision of variables from the algorithm model.

In the binomial-expression model generation processing, loop processing is performed four times as shown in FIG. 4.

And, in first loop processing, fixing the output variable of a model description expression including multiplication and division, fixing the input variables related to multiplication and division, and binomializing multiplication and division are performed.

Accordingly, the expression selection section 14 first obtains a model description expression stored in the program storage section 12 (step ST11). The expression selection section 14 obtains a model description expression described at the beginning of the algorithm model.

In the example in FIG. 6, the expression selection section 14 first obtains "x=a*b*c". The symbol "*" is a multiplication operator.

After obtaining the model description expression, the expression selection section 14 determines whether the model description expression contains a predetermined variable of interest, and a predetermined operator of interest.

In first loop processing, the expression selection section 14 assumes a multiplication operator (*) and a division operator ("÷" or "/") to be an operator of interest, and determines whether the obtained model description expression contains an operator of interest (step ST12). The expression "x=a*b*c" includes multiplication operators.

And, if the model description expression does not include an operator of interest, the expression selection section 14 performs step ST16 described later.

Also, if the model description expression includes an operator of interest, the expression selection section 14 extracts an output variable on the left side of the obtained model description expression as a variable of interest, and instructs the variable fixing section 15 to perform fixing processing on the variable of interest (step ST13).

In the case of "x=a*b*c", the output variable "x" is extracted as a variable of interest.

The variable fixing section 15 determines the bit width of (here, the output variable of the model description expression including multiplication and division) from the obtained model description expression, an operator of interest, and variables of interest. The variable fixing section 15 determines the bit width of the variables of interest.

When fixing the output variable of the model description expression, the variable fixing section 15 first performs simulation of the obtained model description expression, and obtains a maximum value of the output variable (absolute value). Thereby, the integer part of the output variable of the obtained model description expression is determined.

The bit-precision list storage section 13 stores the number of bits of the integer part.

Next, the variable fixing section 15 determines the number of bits of the decimal part of the output variable so that the output variable value changes within the range less than a permissible error of the output variable.

The bit-precision list storage section 13 stores the number of bits of the decimal part.

By the above-described processing, the variable fixing section 15 determines the bit width of the variable of interest.

And, the bit-precision list storage section 13 stores the bit width of the generated variable of interest (output variable). Thereby, the bit precision of the output variable of the obtained model description expression is determined.

As shown in FIG. 7, a floating-point output variable "x" is converted into a fixed-point output variable "X".

After instructing the fixing processing of the variable of interest (output variable), as shown in FIG. 4, the expression selection section 14 further extracts input variables to be subjected to multiplication and division as variables of interest, and instructs the variable fixing section 15 to perform fixing processing of the variables of interest (step ST14).

In the case where "x=a*b*c", input variables "a", "b" and "c" are extracted as variables of interest.

The variable fixing section 15 performs the processing in FIG. 5 so that the variables of interest (input variables) are fixed.

Specifically, the variable fixing section 15 first performs simulation of the obtained model description expression (step ST51), and obtains a maximum value (absolute value) of each input variable (step ST52).

Thereby, the integer parts of all the input variables included in the obtained model description expression are determined.

The bit-precision list storage section 13 stores the number of bits of the integer part.

In this regard, at this stage, these input variables are operated as floating-point variables.

Next, in order to obtain the number of bits of the decimal part of the variables of interest (input variables), the variable fixing section 15 first adds the decimal part with a sufficient number of bits not generating a rounding error to all the variables of interest included in the obtained model description expression (step ST53).

After that, the variable fixing section 15 reduces the same number of bits (for example, 1 bit) as the number of bits of the decimal part of the variables of interest (input variables) (step ST54), and performs simulation (step ST55). At this time, unfixed variables other than the variables of interest are operated as floating-point variables.

Also, the variable fixing section 15 determines whether an error of the output variable is not greater than a permissible error (step ST56).

And, if the error of the output variable is not greater than the permissible error, the variable fixing section 15 repeats number-of-bits reduction processing (step ST54) and simulation (step ST55) until the error exceeds the permissible error.

Also, when the error of the output variable becomes greater than the permissible error, the variable fixing section 15 adds one bit to one variable of interest (step ST57), and performs simulation (step ST58). At this time, unfixed variables other than the variables of interest are operated as floating-point variables.

The variable fixing section 15 performs the same simulation for each variable of interest (step ST59).

From these simulation results with a increased number of bits of a plurality of input variables of interest, the variable fixing section 15 identifies the input variable which causes the error of the output variable becomes a maximum (step ST60).

And, the variable fixing section 15 fixes the number of bits of the decimal part of the input variable that causes the error to become a maximum as the number of bits at this point in time (step ST61).

Also, the variable fixing section 15 repeats steps ST57 to ST61 until there is no variable of interest to be processed (step ST62).

In this regard, when fixing the input variables of a second and after, included in the obtained model description expression, fixed bit widths are used for the fixed input variables in advance.

The variable fixing section 15 determines the bit width of the variables of interest (here, input variables to be subjected to multiplication and division) from the obtained model description expression, the operators of interest, the variables of interest, and the bit width of already operated output variable.

Also, the bit-precision list storage section 13 stores the bit widths of the generated variables of interest.

Thereby, the bit precision of input variables to be subjected to multiplication and division in the obtained model description expression is determined.

As shown in FIG. 8, floating-point input variables "a", "b" and "c" are converted into fixed-point input variables "A", "B", and "C".

After instructing fixing processing on the output variable and input variables to be subjected to multiplication and division, the expression selection section 14 instructs the intermediate-variable generation section 16, the operation-order determination section 17, and the binomial-expression generation section 18 to perform binomializing processing of arithmetic processing on the operators of interest (step ST15).

In the case of "x=a*b*c", all of "x=a*b*c" are to be subjected to binomial expression processing.

In this regard, for example, if the number of the input variables of interest is three or more, or if the obtained model description expression includes input variables of interest and the total number of the input variables of interest is three or more, the expression selection section 14 ought to instruct the binomial expression processing.

The intermediate-variable generation section 16 generates the number of intermediate variables corresponding to the number of operators in the obtained model description expression.

In the case of binomializing "X=A*B*C" in FIG. 9, one intermediate variable "tmpx1" is generated.

The bit-precision list storage section 13 stores the intermediate variables generated by the intermediate-variable generation section 16.

The operation-order determination section 17 determines the order of operations which decreases rounding errors, and determines the assignment of a plurality of variables included in the obtained model description expression.

For example, if the bit widths of the fixed input variables "A", "B" and "C" are "B>A>C", the operation-order determination section 17 assigns the input variables A and C to the logical expression of the intermediate variable tmpx1, and assigns the input variable B and the intermediate variable tmpx1 to the logical expression of the output variable X.

The binomial-expression generation section 18 generates a plurality of logical expressions including at least one binomial expression from the obtained model description expression on the basis of the assignment of the plurality of variables determined by the operation-order determination section 17.

For example, the binomial-expression generation section 18 generates "tmpx1=A*C" as the logical expression of the intermediate variable tmpx1, and generates "X=B*tmpx1" as the logical expression of the output variable X.

And, the expression update section 19 updates the obtained model description expression stored in the program storage section 12 by the plurality of logical expressions generated by the binomial-expression generation section 18.

Thereby, as shown in FIG. 9, binomial expressions "tmpx1=A*C" and "X=B*tmpx1" are stored in the program storage section 12 in place of "x=a*b*c".

After instructing the binomial expression processing on the obtained model description expression, the expression selection section 14 determines whether the currently obtained model description expression is a lastly obtained model description expression stored in the program storage section 12. (step ST16).

Since "x=a*b*c" is a first model description expression of the circuit model, in this case, it is determined that the expression is not a lastly obtained model description expression.

And, if the currently obtained model description expression is not a lastly obtained model description expression in the program storage section 12, the expression selection section 14 obtains the next model description expression in the program storage section 12, and performs the above-described first loop processing on the newly obtained model description expression.

Thereby, as shown in FIG. 9, the first model description expression, in FIG. 6, including the multiplication operator "*" is converted into two logical expressions.

Also, as shown in FIG. 9, the third model description expression, in FIG. 6, "z=g*h+i*j+k*l" is converted into three logical expressions "tmpz1=G*H", "tmpz2=I*J", and "Z=tmpz1+tmpz2+k+l".

Also, three intermediate variables "tmpx1", "tmpz1", and "tmpz2" are added to the bit-precision list 21.

Also, if the currently obtained model description expression is the lastly obtained model description expression in the program storage section 12, the expression selection section 14 completes the first loop processing, and then starts the second loop processing.

In the second loop processing, the fixing processing of the intermediate variables (intermediate variables for binomializing multiplication and division) generated by the first loop processing is performed.

In FIG. 9, the three intermediate variables "tmpx1", "tmpz1" and "tmpz2" are generated.

Accordingly, by the first loop processing and the second loop processing, multiplication and division are binomialized, and the input variables and the output variable (including intermediate variables) included in the binomial expressions of the multiplication and division are fixed.

For this purpose, the expression selection section 14 first obtains a model description expression stored at the beginning in the program storage section 12 (step ST21).

After obtaining the model description expression, the expression selection section 14 determines whether the model description expression includes a predetermined operator of interest.

In the second loop processing, the expression selection section 14 assumes a multiplication operator and a division operator to be operators of interest, and determines whether the obtained model description expression includes the operator of interest (step ST22).

In the case of FIG. 9, when the expression selection section 14 obtains, for example, the second logical expression or the sixth logical expression, which are logical expressions including a description of operators of interest (unfixed intermediate variables) as input variables, the expression selection section 14 determines that the obtained model description expression has an operator of interest.

Also, the expression selection section 14 determines that the other logical expressions do not include the operators of interest.

And, if the obtained model description expression does not include the operators of interest, the expression selection section 14 performs step ST24 described later.

Also, if the obtained model description expression includes the operators of interest, the expression selection section 14 extracts unfixed input variables on the right side of the obtained model description expression as the variables of interest, and instructs the variable fixing section 15 to perform fixing processing on the variables of interest (step ST23).

In the case of FIG. 9, the variable fixing section 15 determines the bit width of the variables of interest (here, input variables) from, for example, the obtained model description expression, the operator of interest, and the variables of interest.

Also, the bit-precision list storage section 13 stores the bit width of the generated variables of interest (input variables).

Thereby, the bit precision of the input variables of the obtained model description expression is determined.

After instructing the fixing processing of the variables of interest (output variables), the expression selection section 14 determines whether the currently obtained model description expression is a lastly obtained model description expression stored in the program storage section 12 (step ST24).

And, if the currently obtained model description expression is not a lastly obtained model description expression in the program storage section 12, the expression selection section 14 obtains the next model description expression in the program storage section 12, and performs the above-described second loop processing on the newly obtained model description expression.

By the second loop processing, as shown in FIG. 10, the three intermediate variables "tmpx1", "tmpz1", and "tmpz2", which were generated by the first loop processing, are fixed, and are changed to "TMPX1", "TMPZ1", and "TMPZ2".

Also, if the currently obtained model description expression is a lastly obtained model description expression in the program storage section 12, the expression selection section 14 completes the second loop processing, and then starts the third loop processing.

In the third loop processing, binomializing addition and subtraction is performed.

For this purpose, the expression selection section 14 first obtains a model description expression stored in the program storage section 12 (step ST31).

The expression selection section 14 obtains a model description expression described at the beginning of the algorithm model.

After obtaining the model description expression, the expression selection section 14 determines whether the model description expression includes predetermined variables of interest, and predetermined operators of interest.

In the third loop processing, the expression selection section 14 assumes an addition operator and a subtraction operator to be operators of interest, and determines whether the obtained model description expression includes the operator of interest (step ST32).

And, if the obtained model description expression does not include operators of interest, the expression selection section 14 performs step ST34 described later.

If the obtained model description expression includes the operators of interest, the expression selection section 14 instructs the intermediate-variable generation section 16, the operation-order determination section 17, and the binomial-expression generation section 18 to perform binomializing processing of arithmetic processing on operators of interest (step ST33).

The intermediate-variable generation section 16 generates as many number of intermediate variables as 1 subtracted from the number of operators of interest included in the obtained model description expression.

The intermediate variables generated by the intermediate-variable generation section 16 are added to the bit-precision list storage section 13.

The operation-order determination section 17 determines the order of operations so as to reduce the rounding error, and determines the assignment of a plurality of variables included in the obtained model description expression.

For example, if there are fixed input variables and unfixed input variables, the variables are assigned such that the fixed input variables are operated later than the unfixed input variables.

In addition, for example, if there are a plurality of fixed input variables, the variables are assigned such that the input variables having a larger bit width are operated later than the input variables having a smaller bit width.

By this processing, it is possible to reduce the possibility that a rounding error caused by multiplication and division is propagated and increased by a plurality of operations.

The binomial-expression generation section 18 generates a plurality of logical expressions including at least one binomial expression from the obtained model description expression on the basis of the assignment of the plurality of the variables, determined by the operation-order determination section 17.

And, the expression update section 19 updates the obtained model description expression stored in the program storage section 12 by the plurality of the logical expressions generated by the binomial-expression generation section 18.

After instructing the binomial expression processing on the obtained model description expression, the expression selection section 14 determines whether the currently obtained model description expression is a lastly obtained model description expression stored in the program storage section 12. (step ST34).

And, if the currently obtained model description expression is not a lastly obtained model description expression in the program storage section 12, the expression selection section 14 obtains the next model description expression in the program storage section 12, and performs the above-described third loop processing on the newly obtained model description expression.

Thereby, as shown in FIG. 11, a model description expression including addition and subtraction is binomialized while the input variables and the output variable to be subjected to addition and subtraction remain unfixed.

In this regard, FIG. 11 illustrates an example in which the bit width of "TMPZ2" is larger than the bit width of "TMPZ1". Thus, "TMPZ2" is included in a binomial expression disposed subsequently to the binomial expression including "TMPZ1" as an input variable.

Also, if the currently obtained model description expression is a lastly obtained model description expression in the program storage section 12, the expression selection section 14 completes the third loop processing, and then starts the fourth loop processing.

In the fourth loop processing, the expression selection section 14 performs fixing processing of all the unfixed variables.

At this point in time, the unfixed variables include the input variables to be subjected to addition and subtraction, the output variable of the model description expression including only addition and subtraction, intermediate variables generated at the time of binomializing a model description expression including addition and subtraction.

Accordingly, by the third loop processing and the fourth loop processing, addition and subtraction are binomialized, and the input variables and the output variable (including intermediate variables) included in the binomial expressions of the addition and subtraction are fixed.

For this purpose, the expression selection section 14 first obtains a model description expression stored at the beginning in the program storage section 12 (step ST41).

After obtaining the model description expression, the expression selection section 14 determines whether the model description expression includes a predetermined operator of interest.

In the fourth loop processing, the expression selection section 14 determines whether the model description expression includes the unfixed input variables and the output variable (step ST42).

And, if the obtained model description expression does not include the operators of interest, the expression selection section 14 performs step ST44 described later.

Also, if the obtained model description expression includes the operators of interest, the expression selection section 14 instructs the variable fixing section 15 to perform fixing processing on the variables of interest (step ST43).

The variable fixing section 15 determines the bit width of a variable of interest. For example, the variable fixing section 15 first determines the bit width of the output variable.

In this regard, the integer part of the output variable of a binomial expression comes to have a bit width which is one bit added to a larger one of the bit widths of the integer parts of the two input variables.

After that, the variable fixing section 15 determines the bit width of the input variables in consideration of the permissible error of the output variable.

And, the bit-precision list storage section 13 stores the bit width of the generated variable of interest.

Thereby, the bit precision of the output variable of the obtained model description expression is determined.

After instructing the fixing processing of the variables of interest, the expression selection section 14 determines whether the currently obtained model description expression is a lastly obtained model description expression stored in the program storage section 12 (step ST44).

And, if the currently obtained model description expression is not a lastly obtained model description expression program storage section 12, the expression selection section 14 obtains the next model description expression in the program storage section 12, and performs the above-described fourth loop processing on the newly obtained model description expression.

Also, if the currently obtained model description expression is a lastly obtained model description expression program storage section 12, the expression selection section 14 completes the fourth loop processing, and then completes the generation processing of a binomial expression model.

Thereby, as shown in FIG. 12, all the input variables and the output variable included in a binomial expression of addition and subtraction are fixed.

Also, a plurality of the binomial expressions in FIG. 12 have optimized bit widths in the individual binomial expressions.

And, the program storage section 12 stores the binomial expression model in FIG. 12.

Also, the bit-precision list storage section 13 stores the bit widths of all the variables included in the binomial expression model in FIG. 12.

As described above, in the hardware-model generation apparatus 1 according to the embodiment, a binomial model program is generated from an algorithm model program. Furthermore, the information on the bit precision of a plurality of the variables included in the binomial expression of the binomial model program is generated.

In this manner, logical expressions in an algorithm model program is binomialized, and the variables of the binomial expression are fixed so that it becomes possible for the binomial model program to use a net list, etc., as a hardware model program.

Also, in this embodiment, as shown in FIG. 4, the multiplication and division operations in an algorithm model program are binomialized in advance, and then the addition and subtraction operations are binomialized.

Furthermore, in this embodiment, if the addition and subtraction operations are binomialized, binomialization is performed such that the input variables and the output variable, which are fixed in advance and related to the multiplication and division operations, (intermediate variables generated at the time of binomialization of the multiplication and division operations) are subjected to addition and subtraction after the input variables related to the addition and subtraction operations.

Accordingly, in this embodiment, the number of operations of the multiplication and division operations with rounding errors is minimized, and thus an increase in rounding errors is restrained.

Also, in this embodiment, it is possible to determine the bit width of the input variables of the multiplication and division operations such that the rounding errors of the multiplication and division are kept within a permissible error of the output variable.

Also, in this embodiment, binomialization is performed such that the input variables (intermediate variables) with a larger bit width are operated later than input variables (intermediate variables) with a smaller bit width.

Accordingly, a rounding error of the bit width can be minimized.

Further, in this embodiment, as shown in FIG. 5, the number of bits of an input variable which does not allow obtaining a permissible error for the first time (in the following, called a number of bits with an unpermitted error) is obtained by repeating simulation while equally reducing the bit width of the input variables of the obtained logical expression After that, in this embodiment, simulation is repeatedly performed with one bit added to the number of bits of one input variable of interest with an unpermitted error for each variable of interest.

And, in this embodiment, a determination is made of the bit width of the variable of interest producing a maximum error of the output variable to be a bit width of the simulation, that is to say, one bit added to the number of bits with the unpermitted error.

Accordingly, in this embodiment, the bit width of the input variables in each binomial expression becomes a minimum bit width allowing a permissible error to be obtained.

Thereby, the following advantages can be obtained as advantages of the present embodiment.

First, in this embodiment, it is possible to automatically convert an algorithm model program described using floating-point variables into a hardware model program (binomial-expression model program) described using fixed-point variables.

Furthermore, in this embodiment, even if a logical expression of the algorithm model program is a polynomial logical expression having input variables with three terms or more, it is possible to automatically convert the logical expression into a hardware model program.

Second, in this embodiment, it is possible to automatically determine the order of a plurality of binomial expressions in a hardware model program so as to perform operations in the order of operations in consideration of rounding errors.

Third, in this embodiment, automatic identification is performed on an input variable which increases an output error among the input variables included in a polynomial logical expression, and the bit width is fixed from the input variable.

Thereby, it is possible to keep an output variable error, which is caused by the input variable error, not to exceed a permissible error.

Fourth, in this embodiment, assignment of the bit width is performed by giving priority to the input variables related to multiplication and division operations, which increase the output error, so that it is possible to restrain an increase in a package area of a circuit, which is caused by unnecessary bit widths, and to keep the output variable error within the permissible error.

Accordingly, in this embodiment, it is possible to reduce a package area of a circuit by setting a large permissible error, for example.

Also, on the contrary, in this embodiment, it is possible to ensure high bit precision by setting a small permissible error.

That is to say, in this embodiment, it is possible to optimize the order of a plurality of binomial expressions and the bit widths of variables in accordance with a circuit to be designed.

Fifth, in this embodiment, it is possible to perform the automated processing by certain loop processing as shown in FIG. 4.

Accordingly, in this embodiment, it is possible to determine the bit precision by a linear amount of processing to the number of variables.

Also, in this embodiment, if the variables to be processed increase in the total number, the amount of processing does not increase exponentially, and thus the bit precision can be determined with a linear increase in the amount of processing.

The above-described embodiment is an example of preferable embodiments of the present invention. However, the present invention is not limited to this, and various variations and modifications are possible without departing from the spirit and scope of the invention.

Variations

For example, in the third and the fourth loop processing of the flowchart shown in FIG. 4, the expression selection section 14 may perform the same processing as the first and the second loop processing.

That is to say, in the third loop processing, the expression selection section 14 may perform fixing the output variable of the model description expression including addition and subtraction, fixing the input variables related to addition and subtraction, and binomializing addition and subtraction.

Also, in the fourth loop processing, the expression selection section 14 may perform the fixing processing of the intermediate variables (intermediate variables for binomializing addition and subtraction) generated by the third loop processing.

In this manner, even if the third and the fourth loop processing are changed, it is possible to generate a binomial model program (hardware model program) from an algorithm model program, and further to determine suitable bit precision of the variables of the binomial expressions in accordance with a circuit.

The present application contains subject matter related to that disclosed in Japanese Priority Patent Application JP 2009-010015 filed in the Japan Patent Office on Jan. 20, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An arithmetic-program conversion apparatus comprising:
- a program storage section storing an arithmetic program describing a circuit to be designed by a logical expression including a plurality of input variables, operators, and an output variables;
- if the logical expression having three input variables or more is stored in the program storage section, an intermediate-variable generation section generating an intermediate variable to be used for converting the logical expression into a plurality of binomial expressions wherein each binomal expression includes two input variables and one output variable;
- if the intermediate variable is generated by the intermediate-variable generation section, an expression conversion section converting the logical expression into a plurality of binomial expressions including a binomial expression for obtaining the intermediate variable and a binomial expression for obtaining the output variable from the intermediate variable;
- if a plurality of binomial expressions are generated by the converting process of the expression conversion section, an expression update section updating the logical expression originally stored in the program storage section by the plurality of binomial expressions;
- a bit-width determination section determining bit widths of the output variable, the input variables, and the intermediate variable of the logical expression stored in the program storage section; and
- a bit-width storage section storing the bit width of the output variable, the bit width of the input variables, and the bit width of the intermediate variable.

2. The arithmetic-program conversion apparatus according to claim 1,
- wherein the intermediate-variable generation section and the expression conversion section
- convert the logical expression having the three input variables or more, an intermediate variable has been generated therefrom, and stored in the program storage section into a plurality of logical expressions so that multiplication and division operations included in the logical expression are expressed by binomial expressions, and
- binomialize addition and subtraction operations of the logical expression stored in the program storage section so that the intermediate variable generated for binomializing the multiplication and division operations are used for addition and subtraction after the input variables related to the addition and subtraction operations included in the logical expression having the three input variables or more, thereby converting the logical expression into the plurality of binomial expressions.

3. The arithmetic-program conversion apparatus according to claim 2, further comprising an acquisition section repeating processing obtaining the logical expression stored in the program storage section in sequence from the program storage section for a plurality of times,
- wherein in order to binomialize the multiplication and division operations included in the logical expression,
- in a first sequential acquisition processing of the logical expression,
- the acquisition section causes the bit-width determination section to determine a bit width of the output variable of the obtained logical expression and a bit width of the input variables related to the multiplication and division operations,
- causes the intermediate-variable generation section and the expression conversion section to generate the intermediate variable, and to binomialize the multiplication and division operations, and
- causes the update section to update the logical expression stored in the program storage section; and
- in a second sequential acquisition processing of the logical expression,
- the acquisition section causes the bit-width determination section to determine a bit width of the intermediate variable included in the binomial expression of the multiplication and division operations.

4. The arithmetic-program conversion apparatus according to claim 3,
- wherein in order to binomialize addition and subtraction operations included in the logical expression,
- in a third logical-expression sequential acquisition processing,
- the acquisition section causes the intermediate-variable generation section and the expression conversion section to generate an intermediate variable and to binomialize the addition and subtraction operations,
- causes the expression update section to update the logical expression stored in the program storage section, and
- in a fourth logical-expression sequential acquisition processing,
- the acquisition section causes the bit-width determination section to determine a bit width of a variable, the bit width of which has not been determined.

5. The arithmetic-program conversion apparatus according to claim 3,
- wherein if the logical expression obtained by the acquisition section includes only multiplication and division operators, the intermediate-variable generation section generates as many intermediate variables as 1 subtracted from a number of the multiplication and division operators, and
- if the logical expression obtained by the acquisition section includes multiplication and division operators and addition and subtraction operators, the intermediate-variable generation section generates as many intermediate variables as a number of the multiplication and division operators.

6. The arithmetic-program conversion apparatus according to claim 1,
- wherein the bit-width determination section determines bit widths of the output variable, the input variables, and the intermediate variable based on a permissible error of the output variable of the logical expression.

7. The arithmetic-program conversion apparatus according to claim 1,
- wherein the bit-width determination section determines a bit width of the output variable and a bit width of the input variables related to the multiplication and division operations using the logical expression stored in the program storage section before the logical expression stored in the program storage section is updated to a plurality of logical expressions,
- the bit-width storage section stores the bit width determined by the bit-width determination section, and
- if the expression conversion section binomializes addition and subtraction operations, the expression conversion section identifies the output variable whose bit width is not stored in the bit-width storage section as the intermediate variable.

8. The arithmetic-program conversion apparatus according to claim 1,
wherein regarding the plurality of input variables included in the logical expression, the conversion section assigns the plurality of input variables to the plurality of binomial expressions such that an input variable having a greater bit width is operated in a subsequent binomial expression than an input variable having a lesser bit width.

9. The arithmetic-program conversion apparatus according to claim 1,
wherein after the bit-width determination section obtains a number of bits of an input variable with an unpermitted error, which does not allow obtaining a permissible error, for the first time by repeating simulation while equally reducing a bit width of the input variables of the logical expression,
the bit-width determination section repeats performing a simulation with one bit added to the number of bits of one input variable with an unpermitted error for each input variable, and determines the bit width of the input variable producing a maximum error of the output error to be a bit width of the simulation.

10. The arithmetic-program conversion apparatus according to claim 9,
wherein the bit-width determination section performs a simulation using an input variable other than the input variable whose bit width has been determined and input variable of interest as a floating-point variable.

11. A method of converting an arithmetic program, the method comprising the steps of:
generating an intermediate variable to be used for converting a logical expression constituting an arithmetic program stored in a program storage section and including three input variables or more, an operator, and an output variable into a plurality of binomial expressions wherein each binominal expression includes two input variables and one output variable;
using a processor to convert the logical expression into a plurality of binomial expressions including a binomial expression for obtaining the intermediate variable and a binomial expression obtaining the output variable from the intermediate variable;
updating the logical expression originally stored in the program storage section by the plurality of the converted binomial expressions;
determining bit widths of the output variable, the input variables, and the intermediate variable included in the logical expression stored in the program storage section; and
storing the bit width of the output variable, the bit width of the input variables, and the bit width of the intermediate variable in a bit-width storage section.

12. A program product for causing a computer to achieve processing comprising:
a program storage section storing an arithmetic program describing a circuit to be designed by a logical expression including a plurality of input variables, operators, and an output variable;
if the logical expression having three input variables or more is stored in the program storage section, an intermediate-variable generation section generating an intermediate variable to be used for converting the logical expression into a plurality of binomial expressions wherein each binominal expression includes two input variables and one output variable;
if the intermediate variable is generated by the intermediate-variable generation section, an expression conversion section converting the logical expression into a plurality of binomial expressions including a binomial expression for obtaining the intermediate variable and a binomial expression for obtaining the output variable from the intermediate variable;
if a plurality of binomial expressions are generated by the converting process of the expression conversion section, an expression update section updating the logical expression originally stored in the program storage section by the plurality of binomial expressions;
a bit-width determination section determining bit widths of the output variable, the input variables, and the intermediate variable of the logical expression stored in the program storage section; and
a bit-width storage section storing the bit width of the output variable, the bit width of the input variables, and the bit width of the intermediate variable.

* * * * *